United States Patent [19]
Havens et al.

[11] Patent Number: 5,696,476
[45] Date of Patent: Dec. 9, 1997

[54] OPEN ARCHITECTURE MAGNETIC RESONANCE IMAGING SUPERCONDUCTING MAGNET ASSEMBLY

[75] Inventors: Timothy John Havens; R. Seth Smith, both of Florence, S.C.

[73] Assignee: General Electric Company, Milwaukee, Wis.

[21] Appl. No.: 509,565

[22] Filed: Jul. 31, 1995

[51] Int. Cl.$^6$ .................................................. H01F 1/00
[52] U.S. Cl. .......................... 335/216; 335/299; 324/318
[58] Field of Search .................................... 335/216, 296, 335/299, 301; 324/318, 319, 320

[56] References Cited

U.S. PATENT DOCUMENTS

| | | | |
|---|---|---|---|
| 4,710,741 | 12/1987 | McGinley | 335/296 |
| 5,291,169 | 3/1994 | Ige et al. | 335/216 |
| 5,463,364 | 10/1995 | Müller | 335/299 |

*Primary Examiner*—Lincoln Donovan
*Attorney, Agent, or Firm*—Irving M. Freedman; John H. Pilarski

[57] ABSTRACT

A passively shimmed open architecture magnetic resonance imaging magnet utilizing separated superconducting coil assemblies with open space between including means to obtain a uniform magnetic field in the open space by shaped ferromagnetic bands in the bore of the magnets, the shaping including an axial notch and circumferential holes for attaching passive shims.

10 Claims, 2 Drawing Sheets

FIG_1

OPEN ARCHITECTURE MAGNETIC RESONANCE IMAGING SUPERCONDUCTING MAGNET ASSEMBLY

BACKGROUND OF INVENTION

This invention relates to an open architecture superconducting magnet assembly for a magnetic resonance imaging system (hereinafter called "MRI"), and more particularly to an improved and simplified coil arrangement in such an assembly.

As is well known, a superconducting magnet can be made superconducting by placing it in an extremely cold environment, such as by enclosing it in a cryostat or pressure vessel containing liquid helium or other cryogen. The extreme cold ensures that the magnet coils are superconducting, such that when a power source is initially connected to the coil (for a period, for example, of only ten minutes) to introduce a current flow through the coils, the current will continue to flow through the coils even after power is removed due to the absence of resistance at the superconducting temperature, thereby maintaining a strong magnetic field. Superconducting magnets find wide application in the field of MRI.

While the use of liquid helium to provide cryogenic temperatures has been widely practiced and is satisfactory for MRI operation, helium is commercially obtained only in a few locations. As a result, the provision of a steady supply of liquid helium to MRI installations all over the world has proved to be difficult and costly. This has led to considerable effort being directed at superconducting materials and magnet structures which can be rendered superconducting for MRI use at relatively higher temperatures such as ten degrees Kelvin (10 K), which can be obtained with mechanical cryocooler based conduction cooling.

Another problem encountered by most MRI equipment is that they utilize solenoidal magnets enclosed in cylindrical structures with a central bore opening for patient access. However, in such an arrangement, the patient is practically enclosed in the warm central bore, which can induce claustrophobia in some patients. The desirability of an open architecture MRI magnet in which the patient is not essentially totally enclosed has long been recognized. Unfortunately, an open architecture MRI magnet poses a number of additional and unique technical problems and challenges. One problem is to provide a suitable superconducting structure which will provide the required magnetic field yet occupies much less space than conventional cylindrical MRI magnet structures, and yet which nevertheless can provide the required strong and extremely homogenous magnetic field even though the spaced magnet coils are under considerable electromagnetic forces, plus thermal forces encountered during cool-down from ambient temperature to superconducting temperatures. An open architecture MRI with which the subject invention could be used is disclosed in U.S. Pat. No. 5,389,909 of Timothy J. Havens, issued Feb. 14, 1995; entitled "Open Architecture Magnetic Resonance Passively Shimmed Imaging Superconducting Magnet Assembly," assigned to the same assignee as the subject invention, and hereby incorporated by reference.

In order to compensate for the inhomogeneities in MRI magnets and obtain uniform magnetic fields in the central bore, various arrangements including the use of negative focusing coils have been used to focus and concentrate the magnetic field in the central region of the MRI magnet where the patient imaging must take place.

Existing superconducting magnet designs utilize negative focusing coils which because of magnet field requirements comprise a set of coils which are smaller and at a different radial distance from the axis of the magnet than the main magnet coils.

In the case of conduction cooled $Nb_3Sn$ superconducting tape magnets this presents difficulty in coil lead routing and potential damage to the fragile $Nb_3Sn$ tape leads. Damage to the leads can require substantial time to repair; and in some cases, the leads cannot be repaired resulting in a magnet with a drifting magnetic field. Damage to leads can necessitate cutting the magnet assembly open to repair the leads and/or replace the affected coils. This is a very time-consuming and expensive procedure. To reduce the likelihood of damaging the leads and to minimize the above and other problems, the lead routing must be made as simple as possible, particularly in an open architecture MRI utilizing a plurality of spaced magnet assemblies.

Finally, there are a number of other problems encountered at superconducting temperatures, including problems of differential thermal expansion and contraction of materials, of minimizing cost, and of handling the forces generated by the significant magnetic fields required. All of these overlapping and at times conflicting requirements must be satisfied for a practical and satisfactory MRI superconducting magnet structure.

OBJECTS AND SUMMARY OF INVENTION

It is an object of the present invention to provide an improved superconducting magnet coil assembly for an open architecture MRI magnet which provides desired field homogeneity and focusing while improving and simplifying lead connections.

It is another object of the present invention to provide an improved superconducting magnet coil assembly for an open architecture conduction cooled MRI magnet utilizing $Nb_3Sn$ tape coils with simplified lead connections.

It is a further object of the present invention to provide an uncomplex focusing arrangement in an open architecture MRI magnet which does not require electrical lead connections.

In accordance with one form of the invention, an open architecture superconducting MRI magnet utilizes two spaced superconducting magnet assemblies, each including a main magnet coil on a coil support structure in a housing and a pair of ferromagnetic rings external to the housing to provide a homogeneous field. More particularly, the rings are low carbon steel, and include a notch at the ends remote from the center of the MRI bore. The coil is wound from $Nb_3Sn$ tape and the cooling is cryocooler cooling.

DETAILED DESCRIPTION OF PREFERRED EMBODIMENT OF INVENTION

Figure 1:
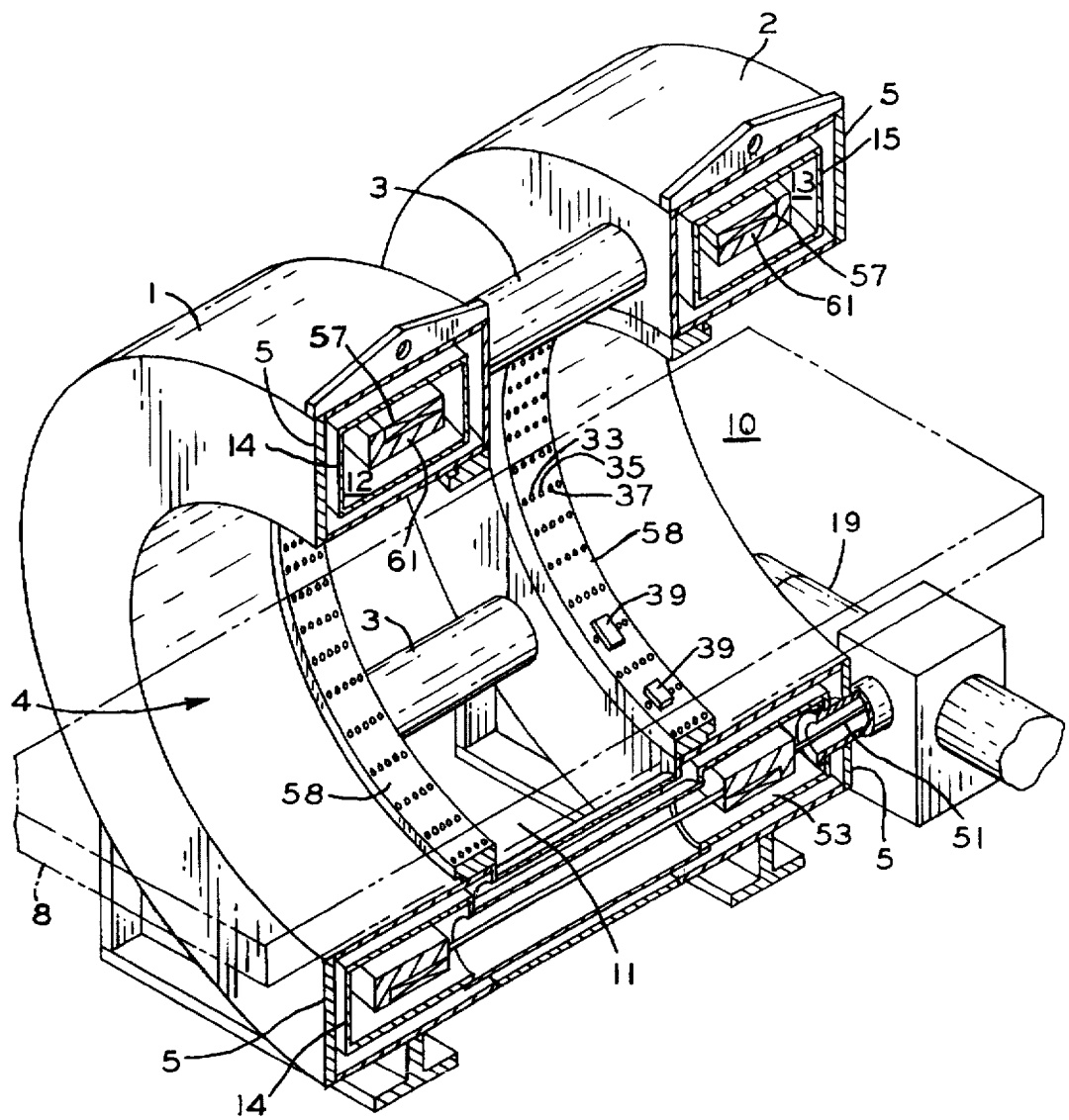
FIG. 1 is a perspective view, partially in cross section, of an MRI superconducting magnet incorporating the present invention.

Referring first to FIG. 1, superconducting magnet assembly 10 includes a pair of toroidal-shaped stainless steel vacuum vessels or housings 1 and 2 with low carbon steel end plates 5 separated by three or four axially extending stainless steel spacers such as 3 positioned near the top and bottom positions around the axis of central bore 4. The structure is symmetrically arranged about bore. 4 of superconducting magnet assembly 10. It is to be noted that the overall structure formed by vacuum vessels 1 and 2 and spacer posts 3 provides substantial openings or open space 11 between vacuum vessels 1 and 2 which avoids enclosure of the patient positioned on the patient support shown generally by dashed member 8. The open space provides access by a medical practitioner, such as a surgeon, to a patient being imaged by the MRI equipment.

Annular cylinders 14 and 15 of rectangular cross section are radiation shields between superconducting magnet coil assemblies 12 and 13, respectively, and vacuum vessels 1 and 2, respectively. Each superconducting magnet assembly 12 and 13 includes an annular main magnet coil 57 wound in cavities or annular grooves with rectangular cross section within magnet coil form 61. Magnet coils 57 are wound of copper stabilized niobium tin ($Nb_3Sn$) ribbon conductor.

Figure 2:
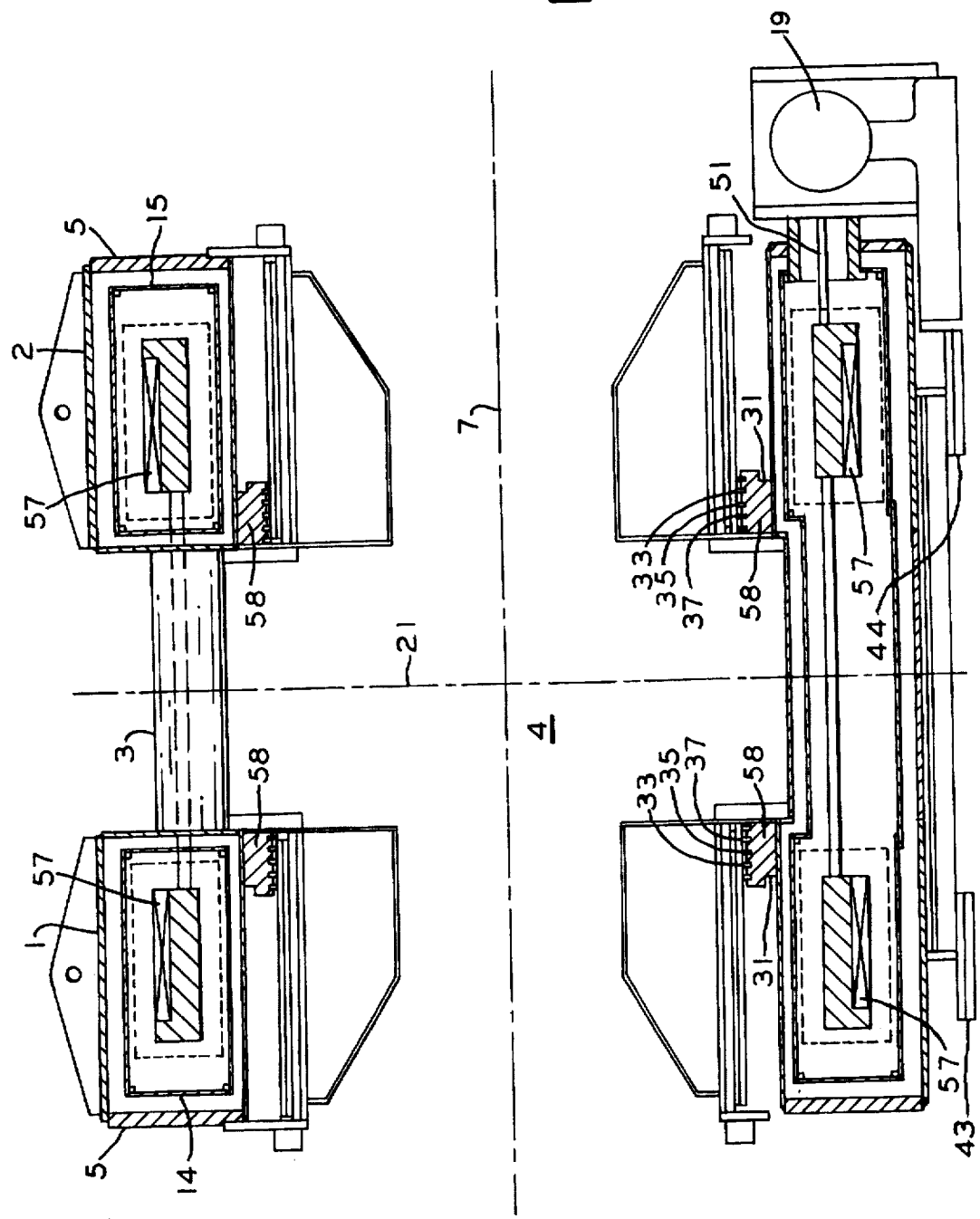
FIG. 2 is a simplified side sectional view of FIG. 1 showing details of the present invention.

Conduction cooling is provided by a Gifford McMahon cryocooler, such as a Leybold model RGD580. Cryocooler 19, best shown in FIG. 2 provides cooling through thermal links 51 in conduits 53 to the interior of annular cylinders 14 and 15 of vacuum vessels 1 and 2, respectively, to cool main magnet coils 57 to superconducting temperatures in the order of ten degrees Kelvin (10 K) to avoid the use of liquid helium cryogen cooling. Power to energize, main magnet coils 57, is supplied by way of suitable electrical connections (not shown).

Magnet assemblies 12 and 13 can be configured and positioned on axis 7 to preclude a negative 22 component of magnetic field in bore 4 and to provide a substantially positive 22 magnetic field in the central region of the bore proximate central plane 21 in accordance with U.S. Pat. No. 5,389,909 referenced above.

Iron band or ring 58 is mounted on the outer surface of housings 1 and 2 surrounding central bore 4 and axially displaced from main magnet coils 57 as best shown in FIG. 2. Ring 58 is C 1006 low carbon steel or other ferromagnetic material with similar ferromagnetic properties.

Iron rings 58 may be positioned on the inner bore of housings 1 and 2 but axially offset or displaced from main magnet coils 57 in that they are closer to the central plane 21 which is perpendicular to bore 4 than their proximate main magnet coil.

Iron rings 58 are welded to housings 1 and 2 and extend approximately 2.5 inches in the radial direction from bore axis 7 and approximately 6.0 inches in the axial direction parallel to axis 7. A notch 31 is about 0.2 inches by 1.0 inches on the inner end remote from central plane 21 provides tailoring of the magnet homogeneity. Drilled and tapped bolt holes 33, 35, and 37 are provided around the circumference of iron rings 58 for selectively positioning and securing smaller shim members such as 39 to further trim or adjust the magnet homogeneity in the imaging region around central plane 21 in bore 4.

Focusing bands or rings 58 avoid the need for negative focusing coils. Since there is no requirement to cool focusing rings 58 to superconducting temperatures, the thermal or cooling load on cryocooler 19 is decreased assisting in providing the cryogenic temperatures required for superconducting magnet assembly 10. The resultant reduced cross section of annular cylinder, or pressure vessels 14 and 15, made possible by elimination of negative focusing coils from inside the pressure vessels reduces the volume to be cooled further decreasing the thermal loading on cryocooler 19, a device with very limited cooling capabilities as compared, for example with cryogen cooling using liquid helium. The reduced cooling requirements greatly simplify the thermal design and cooling requirements for superconducting magnet assembly 10.

The net bore 4 diameter is also increased, since the elimination of focusing coils inside vessels 14 and 15 eliminates the concurrent need for approximately 2 inches of vacuum space insulation otherwise required between the focusing coils and the vessels.

It has been found in utilizing ferromagnetic bands in the manner described above, that the axial force on the main magnet coil 57 increased significantly. The increase over previous designs was surprisingly large, from approximately 40,000 lbs to approximately 50,000 lbs, or about 25%. This increased force can be partially counterbalanced by replacing outer housing flanges 5, which are typically made of stainless steel, with appropriately sized ferromagnetic material. In the embodiment described herein, the flanges were approximately 1.5" thick low carbon steel such as C1006 and C1020.

While the present invention has been described with respect to certain preferred embodiments thereof, it is to be understood that numerous variations in the details of construction, the arrangement and combination of parts, and the types of materials used may be made without departing from the spirit and scope of the invention.

What we claim is:

1. An open architecture conduction-cooled magnetic resonance imaging magnet utilizing a separated pair of superconducting magnet coil assemblies positioned about the axis thereof and forming an axial bore to receive patients, and providing open radial space between the magnet coil assemblies to minimize confinement of the patient within the bore and to maximize access to the patient, comprising:

a first annular superconducting magnet assembly positioned about said axis;

a second annular superconducting magnet assembly positioned about said axis, and spaced from and substantially parallel to said first magnet assembly;

said bore formed by the central regions of said first and second magnet assemblies about said axis;

each of said magnet assemblies including at least one superconducting magnet coil in a housing and means to cool the interior of said housing and said magnet coil to a superconducting temperature to provide a magnetic field within said bore;

each of said magnet assemblies further including a ferromagnetic ring; and said ferromagnetic rings positioned at a radial distance from said axis which is different than the radial distance of said magnet coil from said axis and offset axially from said magnet coils toward the central region of said bore to provide uniformity of said magnetic field without focusing coils and without conducting leads connecting to said rings;

wherein said means to cool is conduction cooling and said magnet coil includes a plurality of tape which is capable of being rendered superconducting by the conduction cooling;

wherein each of said rings are secured to one of the housing and axially displaced from the associated superconducting magnet coil within the housing toward a central plane perpendicular to said axis; and wherein said ring include notches on the ends remote from said central plane, said notches being adjacent to said housings.

2. The open architecture magnetic resonance imaging magnet of claim 1 wherein said tape is $Nb_3Sn$.

3. The open architecture magnetic resonance imaging magnet of claim 2 wherein said superconducting temperature is approximately 10 degrees Kelvin.

4. The open architecture magnetic resonance imaging magnet of claim 3 wherein each of said rings are secured to one of the housings and axially displaced from the associated superconducting magnet coil within the housing toward a central plane perpendicular to said axis.

5. An open architecture conduction-cooled magnetic resonance imaging magnet utilizing a separated pair of superconducting magnet coil assemblies positioned about the axis thereof and forming an axial bore to receive patients, and providing open radial space between the magnet coil assemblies to minimize confinement of the patient within the bore and to maximize access to the patient, comprising:

a first annular superconducting magnet assembly positioned about said axis;

a second annular superconducting magnet assembly positioned about said axis, and spaced from and substantially parallel to said first magnet assembly;

said bore formed by the central regions of said first and second magnet assemblies about said axis;

each of said magnet assemblies including at least one superconducting magnet coil in a housing and means to cool the interior of said housing and said magnet coil to a superconducting temperature to provide a magnetic field within said bore;

each of said magnet assemblies further including a ferromagnetic ring; and said ferromagnetic rings positioned at a radial distance from said axis which is different than the radial distance of said magnet coil from said axis and offset axially from said magnet coils toward the central region of said bore to provide uniformity of said magnetic field without focusing coils and without conducting leads connecting to said rings;

wherein said means to cool is conduction cooling and said magnet coil includes a plurality of turns of tape which is capable of being rendered superconducting by the conduction cooling;

wherein said tape is $Nb_3Sn$;

wherein said rings are positioned on the exterior of said housing proximate to said bore;

wherein each of said rings are secured to one of the housings and axially displaced from the associated superconducting magnet coil within the housing toward a central plane perpendicular to said axis; and wherein said rings include notches on the ends remote from said central plane, said notches being adjacent to said housings.

6. The open architecture magnetic resonance imaging magnet of claim 5 wherein said rings extend in a direction radially to said axis approximately 2.5 inches and extend in an axial direction substantially parallel to said axis approximately 6.0 inches.

7. The open architecture magnetic resonance imaging magnet of claim 6 wherein a plurality of bolt holes extend around the circumference of said rings to enable the attachment of passive shims.

8. The open architecture magnetic resonance imaging magnet of claim 7 wherein each of said housings includes at least one end low carbon steel end plate extending radially relative to said axis.

9. The open architecture magnetic resonance imaging magnet of claim 8 wherein the end plates are approximately 1.5 inches thick.

10. The open architecture magnetic resonance imaging magnet of claim 1 wherein each of said housings includes at least one low carbon steel end plate extending radially relative to said axis.

* * * * *